(12) United States Patent
Garrasi

(10) Patent No.: US 10,862,277 B1
(45) Date of Patent: Dec. 8, 2020

(54) ELECTRIC POWER DISTRIBUTION PANEL

(71) Applicant: Robert Garrasi, Clifton Park, NY (US)

(72) Inventor: Robert Garrasi, Clifton Park, NY (US)

(73) Assignee: VELOX TECHNOLOGY CORPORATION, Clifton Park, NY (US)

( * ) Notice: Subject to any disclaimer, the term of this patent is extended or adjusted under 35 U.S.C. 154(b) by 0 days.

(21) Appl. No.: 16/932,386

(22) Filed: Jul. 17, 2020

Related U.S. Application Data

(60) Provisional application No. 62/875,702, filed on Jul. 18, 2019.

(51) Int. Cl.

| | | |
|---|---|---|
| *H02B 1/04* | (2006.01) | |
| *H02H 7/22* | (2006.01) | |
| *H02H 1/00* | (2006.01) | |
| *G01R 31/52* | (2020.01) | |
| *G01R 31/54* | (2020.01) | |
| *H02B 1/20* | (2006.01) | |
| *H02J 7/35* | (2006.01) | |

(52) U.S. Cl.
CPC ............... *H02B 1/04* (2013.01); *G01R 31/52* (2020.01); *G01R 31/54* (2020.01); *H02B 1/20* (2013.01); *H02H 1/0007* (2013.01); *H02H 7/22* (2013.01); *H02J 7/35* (2013.01)

(58) Field of Classification Search
CPC .................................. H02B 1/04; G01R 31/54
USPC .......................................................... 361/42
See application file for complete search history.

(56) References Cited

U.S. PATENT DOCUMENTS

| | | | | |
|---|---|---|---|---|
| 5,521,838 | A * | 5/1996 | Rosendahl | H02J 3/14 700/295 |
| 7,630,186 | B2 * | 12/2009 | Reynolds | G06F 1/30 361/93.1 |
| 7,672,104 | B2 * | 3/2010 | Reynolds | G06F 1/26 361/93.1 |
| 8,265,776 | B2 * | 9/2012 | Osann, Jr. | H04N 5/2251 700/22 |
| 9,172,275 | B2 * | 10/2015 | Bhakta | H02J 13/00004 13/4 |
| 9,738,165 | B2 * | 8/2017 | Rosendahl | B60L 53/62 |
| 2010/0328849 | A1 * | 12/2010 | Ewing | G06F 11/3062 361/622 |
| 2019/0052075 | A1 * | 2/2019 | Dent | H02J 3/383 |
| 2019/0103742 | A1 * | 4/2019 | Kennedy | H02H 7/22 |

* cited by examiner

*Primary Examiner* — Dharti H Patel

(57) ABSTRACT

An electric power distribution panel/system is disclosed. The system comprises an enclosure or housing including a front panel, a microcontroller, an input power line, and one or more power bus bars. The microcontroller is configured to control the operation of the system. The input power line is configured to receive power from the main power source, such as electric utility company equipment. The bus bars could or may transmit power from the input power line to one or more loads via the plurality of output modules. The plurality of output modules is configured to transmit power to the loads at pre-established levels from the input power line after completion of circuit tests by the microcontroller. The circuit tests ensure secure transfer of power and data to the loads via the bus bars and the plurality of output modules without using circuit breakers.

20 Claims, 6 Drawing Sheets

ELECTRIC POWER DISTRIBUTION PANEL

CROSS-REFERENCE TO RELATED APPLICATION

This application claims priority to U.S. Patent Application No. 62/875,702, titled "ELECTRIC POWER DISTRIBUTION PANEL" filed on Jul. 18, 2019. The specification of the above referenced patent application is incorporated herein by reference in its entirety.

BACKGROUND OF THE INNOVATION

A. Technical Field

The present innovation generally relates to an energy management system. More specifically, the present innovation relates to an energy management system comprising a multi-functional, microprocessor-based, solid-state more effective than legacy electrical power distribution methods and systems.

B. Description of Related Art

In recent years, the necessity of managing and controlling utilization of energy has become exceedingly more important with the continuing existence of energy shortages and the rapidly increasing cost of energy. Along with increasing demand, energy management systems have also evolved to provide facility control and to monitor energy usage, primarily the usage of electrical energy. There is a range of energy management system from a simple timer-based system that turns off a lamp to a centralized, computer-based system that will monitor, control and optimize building systems. The four main devices that are used include programmable time controls, automatic lighting controls, HVAC control system or programmable/smart thermostats, and an energy management/building automation system.

Existing energy management systems, however, have limited capabilities or are expensive, some requiring external computer control. While complex and relatively expensive computers and peripheral equipment can be used economically for large scale energy management and control systems, the cost of such computers and equipment may be prohibitively expensive for energy management and control systems in smaller residential and commercial structures. Few existing patent applications have attempted to address the aforesaid problem, and these patent applications are discussed below.

U.S. Pat. No. 7,554,796 of Coffey, Joseph C., entitled "Modular Power Distribution System And Methods" discloses a modular power distribution system. The system comprises a chassis; and a backplane including a power input, and a plurality of module connection locations. A plurality of modules is mounted in the chassis, each module mounted to one of the module connection locations. Each module includes an OR-ing/ORing diode, a circuit protection device, a microprocessor controlling the circuit protection device and a power output connection location. A circuit option switch is located on each module for setting the current limits for each module and a system control module is connected to the backplane.

U.S. Pat. No. 6,738,692B2 of Schienbein Lawrence A., entitled "Modular, Integrated Power Conversion And Energy Management System" discloses an integrated power conversion and energy management system. The system includes an integrated controller, one or more standard modules, and a custom or semi-custom backplane. The integrated controller accommodates one or more modules to control power quality and/or flow to one or more input and/or output connections. The integrated controller further includes controller software, control circuits, power circuits, protection circuits, external electrical connections, an interface with one or more integrated or modular communications module, and an interface with one or more power modules.

However, the above-mentioned prior arts deal with the energy management and circuit protection using circuit breakers integrated into the backplane. Further, utilizing circuit breakers increases the cost of installation and repair of legacy electrical circuit breaker panels. Also, mechanical breakers need to be reset every time before using.

Therefore, there is a need for an electric power distribution panel/system having multiple electronic modules integrated with a microcontroller for securely transferring power and data to one or more loads using bi-directional bus bars without using physical circuit breakers. Further, there is also a need to provide an electric power distribution panel/system to continuously monitor, regulate, and control energy consumption throughout the structure, building, or facility.

SUMMARY OF THE INNOVATION

A solid-state, microprocessor controlled, electrical power distribution panel/system that provides an enhanced method for effective power distribution is disclosed. The system comprises an enclosure or a housing including a front panel. The front panel is hinged or removable from the enclosure and the main panel is positioned in the enclosure via one or more fasteners. The system/panel is comprised of a non-circuit breaker, solid state microcontroller, an input power line, and one or more power bus bars. The microcontroller is configured to control the operation of the system. The input power line is configured to receive electrical power from a main power source. The one or more are securely positioned within the enclosure, bus bars transfer power from an input power line to a plurality of output modules. Each connection of the one or more bus bars is configured to selectively pass electric power at pre-established levels from the input power line to a plurality of outlets or output modules via a plurality of module insertion points or plug-in points and one or more expansion ports/connections after completion of testing one or more circuit tests. The plurality of output modules is further configured to transfer power to one or more loads at pre-established levels from the input power line after completion of circuit tests by the microcontroller. The circuit tests ensure secure transfer of power and data to the loads via the plurality of transmission traces and the plurality of output modules without using circuit breakers.

In one embodiment, the microcontroller is positioned within the enclosure and is operatively and electrically connected to the one or more bus bars, plurality of module insertion points or plug-in points, and the one or more expansion ports/connections. In one embodiment, the microcontroller is integrated with a human machine interface (HMI). In one embodiment, the microcontroller is configured to control the operation of the system and conduct the circuit tests for securely transferring electrical power and data to the plurality of outlets or loads via the bus bars and the plurality of output modules without using a breaker. In one embodiment, the circuit tests such as, but not limited to, a short circuit test and an open circuit test.

In one embodiment, the system is further configured to transfer and store data related to power consumption, power levels, and frequency and power demands. In another embodiment, the system is further configured to develop reports, projections of power demands, and anticipate on the occurrence of conflict using the stored data. The system further comprises a wireless communication module and an ethernet module, wherein the wireless communication module and the ethernet module are configured to transfer the data via a wireless network to at least one wireless communication device. In another embodiment, the wireless communication device is at least of a device including, but not limited to, smartphone, a laptop, a computer, a personal digital assistant (PDA), and a tablet. In another embodiment, the wireless network is at least any one of a Bluetooth, Wi-Fi, radio waves, wireless local area networks (WLANs), and wireless sensor networks.

The system further comprises at least one universal serial bus port to transfer data via a wired connection to at least one wireless communication device. The system further comprises and is assigned an IP address so that any communications via the internet can be easily sent and received. The microcontroller is further configured to control and monitor the loads for preventing and protecting the system from over current demands, unauthorized connections, and short circuits. The microcontroller is further configured to control the plurality of output modules. The system is further configured to switch from the main power to auxiliary power via the microcontroller. The system is further configured to connect to one or more power panels via a data bus connection, thereby enabling to supply electrical power to the one or more power panels via the data bus connection.

The system further comprises one or more energy storage devices configured to store electrical power generated from one or more solar panels. The system further comprises one or more auxiliary power ports, configured to feed electrical power from the energy storage devices to the plurality of output modules and the loads. The system further comprises a remote-control system, which is configured to enable a user to remotely control the power conditions, levels, power durations, and consumptions, and load regulation. The system is further configured to track one or more wireless communication devices associated with the user and initiating the lighting of each space being occupied by the user at the time of detection and initiate the turning off of the lighting as the tracked device leaves the previously occupied space.

The system is further configured to use the speed of the microcontroller to determine one or more GFI conditions and if determined to be present, the system is configured to turn off the load circuit indicting a GFI fault. The system is configured to supplement power to achieve line and load regulations during unavailability of power.

The applicant's innovation eliminates mechanical electric circuit breakers that are presently used in electric service panels. In doing so, AGFI circuit breaker parts and material costs are reduced by approximately $1,250 for a 2,500 sq. ft. newly constructed house (half that amount for a 1,000-1,200 sq. ft. apartment). Licensed electrician service panel installation costs are reduced by approximately 5-8 hours. In 2018, there were approximately 1.2 million new single-family housing starts, and approximately 400,000 new apartment starts. Total labor and material costs using the applicant's innovation are estimated to be $5 billion to $8 billion annually in the United States alone.

The applicant's innovation is not presently available anywhere in the United States or elsewhere. With the proven ability to reduce labor and material costs of the magnitude stated above, it is clear that the applicant's innovation is both novel and nonobvious, otherwise those costs would have already been eliminated by an existing invention.

A further example of the applicant's innovation's novelty and nonobviousness, is that the applicant's innovation will work not only with legacy wiring systems, but also with the Velox Quick Connect™ wiring system. The Velox Quick Connect™ wiring system reduces wiring labor costs by approximately 60%-75% per installation site.

Other objects, features and advantages of the present innovation will become apparent from the following detailed description. It should be understood, however, that the detailed description and the specific examples, while indicating specific embodiments of the innovation, are given by way of illustration only, since various changes and modifications within the spirit and scope of the innovation will become apparent to those skilled in the art from this detailed description. The patent examiner can view a video showing a working demonstration of the innovation at www.vlxtech.com. A password is required to view the clip and will be provided to the examiner upon request.

BRIEF DESCRIPTION OF DRAWINGS

The foregoing summary, as well as the following detailed description of the innovation, is better understood when read in conjunction with the appended drawings. For the purpose of illustrating the innovation, exemplary constructions of the innovation are shown in the drawings. However, the innovation is not limited to the specific methods and structures disclosed herein. The description of a method step or a structure referenced by a numeral in a drawing is applicable to the description of that method step or structure shown by that same numeral in any subsequent drawing herein.

DETAILED DESCRIPTION OF EMBODIMENTS

A description of embodiments of the present innovation will now be given with reference to the Figures. It is expected that the present innovation may be embodied in other specific forms without departing from its spirit or essential characteristics. The described embodiments are to be considered in all respects only as illustrative and not restrictive.

Figure 1:
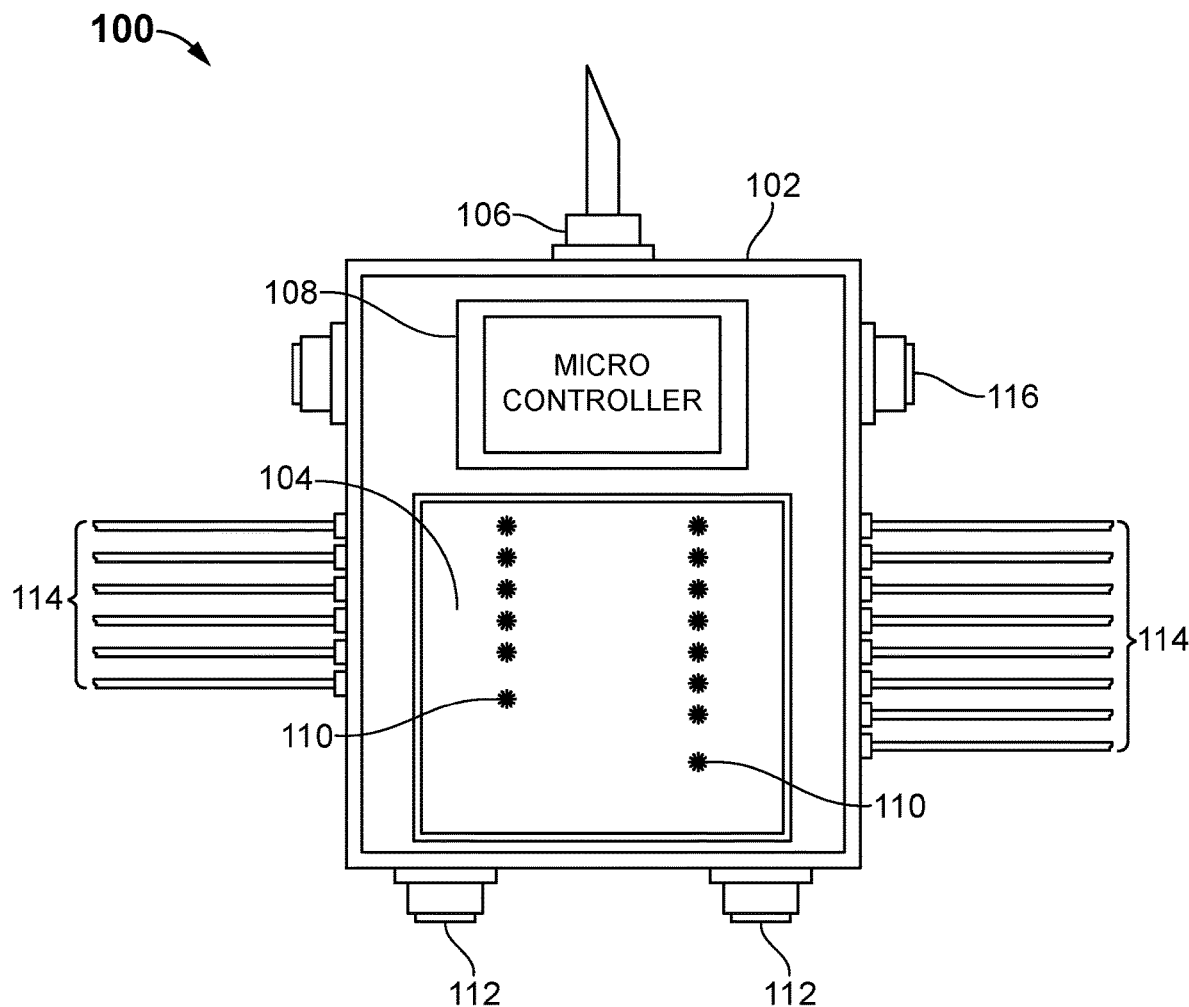
FIG. 1 shows a front view of an electric power distribution panel/system in an embodiment of the present innovation.

Referring to FIG. 1, an electric power distribution panel/system 100 is configured to provide effective power distribution is disclosed. In one embodiment, the system 100 comprises an enclosure or a housing 102, a front panel 104, an input power line 106, a microcontroller 108 integrated to a human machine interface, one or more auxiliary ports 112, and one or more expansion ports/connections 116. In another embodiment, the front panel 104 is hinged to the enclosure 102. In another embodiment, the front panel 104 could be removably positioned on the enclosure 102. The input power line 106 is configured to receive electrical power from a main power source, for example, a power grid. In another embodiment, the front panel 104 includes a plurality of lights 110. In another embodiment, the plurality of lights 110 could be, but not limited to, light emitting diodes (LEDs). In another embodiment, the panel/system 100 comprises a plurality of load/output line connections or cables 114 for transmitting power to one or more loads. In another embodiment, the system 100 could be mounted on a surface, but not limited to, a wall using one or more fasteners. In another embodiment, the enclosure 102 is made of a material, but not limited to, metal. In another embodiment, the system 100 is resistant to water intrusion.

Figure 2:
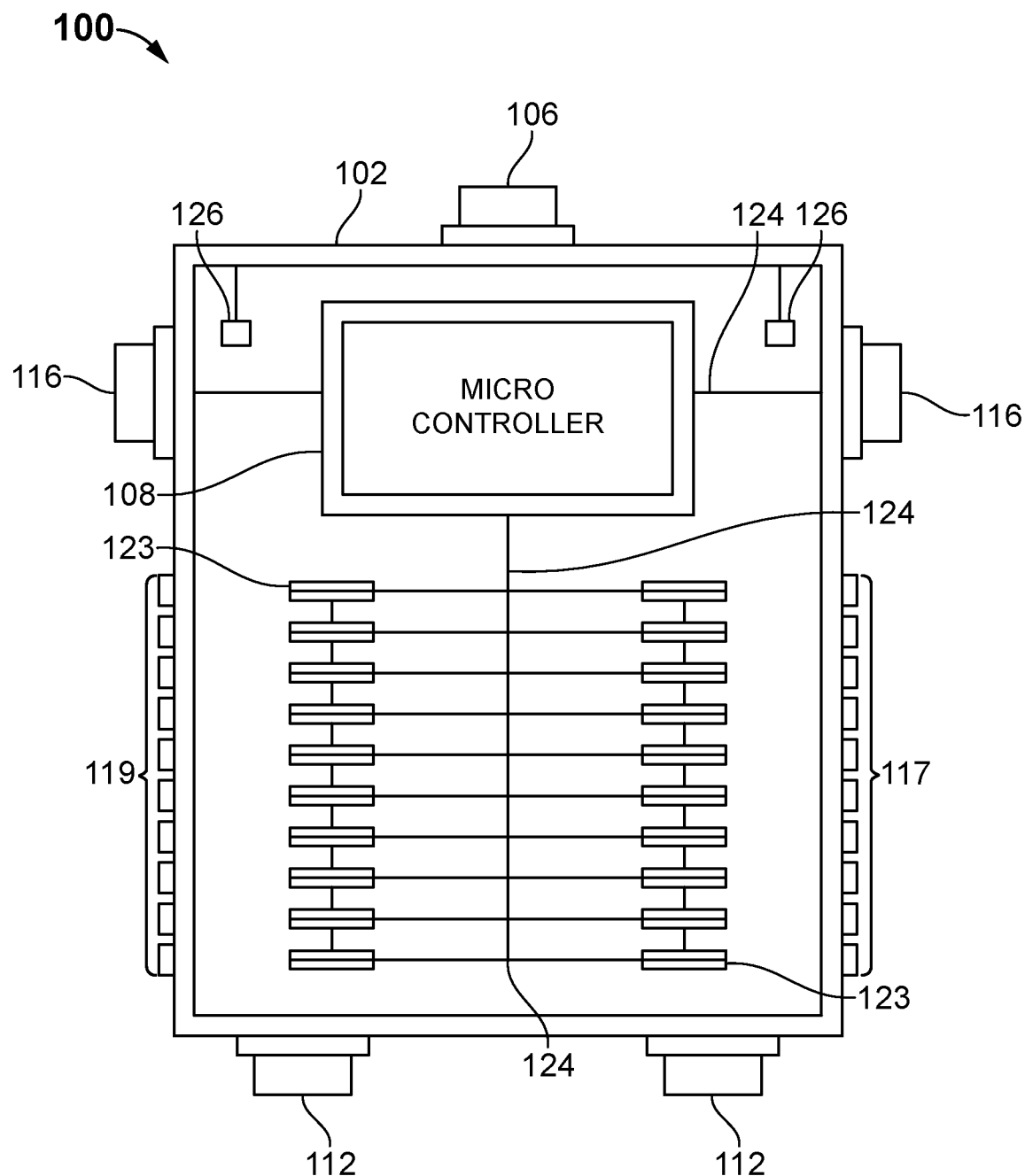
FIG. 2 shows a front view of the electric power distribution panel/system including one or more bi-directional communications transmission lines in one embodiment of the present innovation.
Figure 3:
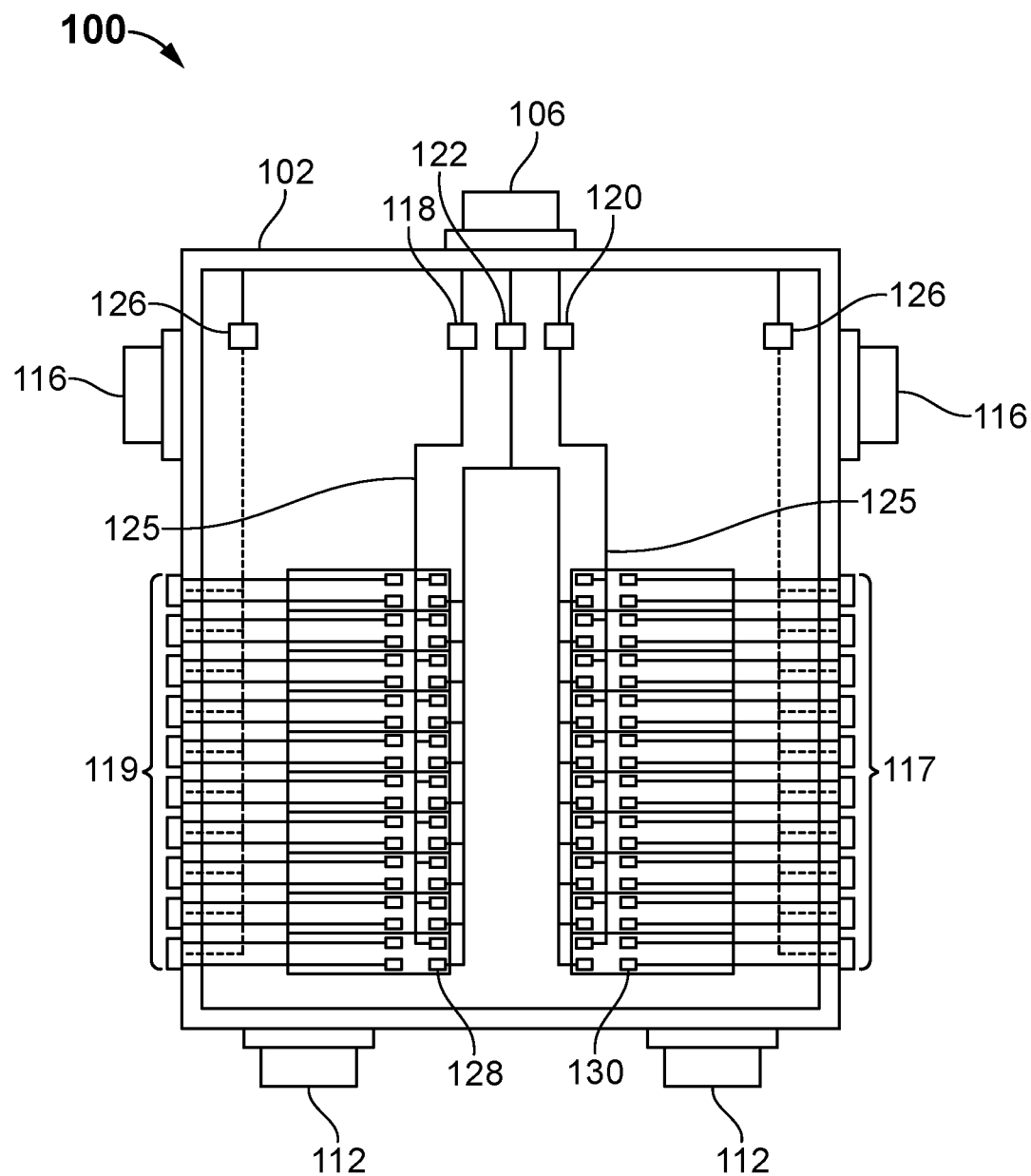
FIG. 3 shows a front view of the electric power distribution panel/system including one or more power bus bars in one embodiment of the present innovation.

FIG. 2 shows a front view of the electric power distribution panel/system 100 including one or more bi-directional communications transmission lines 124 in one embodiment of the present innovation. FIG. 3 shows a front view of the electric power distribution panel/system 100 including one or more power bus bars 125 In another embodiment of the present innovation. Referring to FIG. 2 and FIG. 3, the system 100 includes a plurality of bi-directional communication transmission lines 124 are disclosed. In another embodiment, the bi-directional communication transmission lines 124 in communication with a plurality of module insertion points or plug-in points 123, a microcontroller 108 integrated with a human machine interface, and one or more expansion ports/connections 116. In one embodiment, the plurality of module insertion points 123 is configured to receive one or more loads for transferring power received from the power source, for example, power grid, via the input power line 106. In another embodiment, the plurality of module insertion points 123 is configured to receive one or more loads for transferring data from the system 100 via the bi-directional communication transmission lines 124. In one embodiment, the plurality of module insertion points 123 could be, but not limited to, a plurality of printed circuit board (PCB) mounted edge connectors. In one embodiment, the electric power distribution panel/system 100 comprises a plurality of output connections/ports (117 and 119) is disclosed. In yet another embodiment, the system 100 is integrated with one or more auxiliary ports 112, which are configured to feed power from one or more energy storage devices, for example, batteries.

FIG. 3, the system 100 includes and discloses a plurality of power bus bars 125. In one embodiment, the bus bars 125 supply power to a plurality of power points/connections (128 and 130) via at least two power lines (118 and 120) and a neutral line 122. Referring to FIG. 2 and FIG. 3, the system 100 may be provided with at least two power lines (118 and 120), a neutral line 122, one or more ground bus bars/lines 126, and a plurality of power points/connections (128 and 130). The power lines (118 and 120) and the neutral line 122 are further electrically connected to the bus bars 125 for distributing power to one or more loads. In another embodiment, at least two power lines (118 and 120) and a neutral line 122 are taken from the electric utility. In another embodiment, the ground bus bars/lines 126 are in ground connections.

In one embodiment, the plurality of power points/connections (128 and 130) may be connected to one or more loads for transmitting power via the bus bars 125 from the input power line 106, the power lines (118 and 120), and the neutral line 122. The input power line 106 will receive the main power from a power source, for example, a power grid or an electric utility. In an exemplary embodiment, the system 100 is configured to transfer power in the range of, but not limited to, 110 VAC, 20 A-40 A, and 220 VAC, 40 A-50 A.

In one embodiment, the expansion connections/ports 116 are configured to provide an expansion capability that enables them to add additional circuits. In yet another embodiment, the system 100 is integrated with one or more auxiliary ports 112, which are configured to feed power from one or more energy storage devices, for example, batteries, to the plurality of output modules (134 and 136) (shown in FIG. 4) and the loads.

Figure 4:
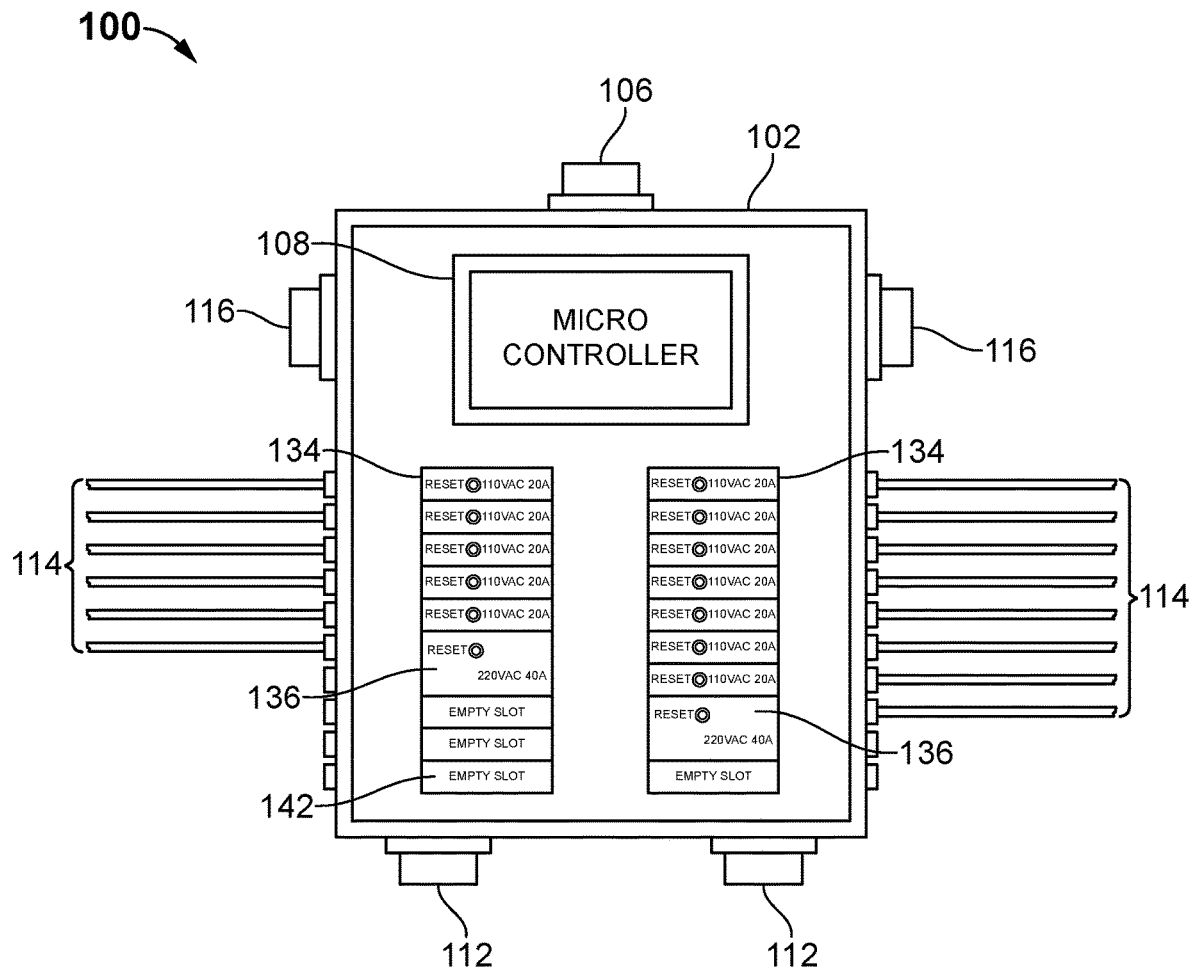
FIG. 4 shows a front view of the electric power distribution panel/system provided with a microcontroller and modules in one embodiment of the present innovation.

FIG. 4 discloses the microcontroller 108 integrated to a human machine interface (HMI) of the system/panel 100. In one embodiment, the microcontroller 108 is configured to control the operation of the system 100. In another embodiment, the microcontroller 108 is positioned within the enclosure 102 of the system 100. In another embodiment, the human machine interface is at least any one of, but not limited to, a display, a touch screen, and a keyboard. In another embodiment, the human machine interface is configured to enable a user to reprogram the microcontroller 108. In another embodiment, the system 100 further comprises a plurality of output modules (134 and 136). In another embodiment, the microcontroller 108 is further configured to monitor and control the plurality of output modules (134 and 136). The output modules (134 and 136) could be automatically turned on and turned off by the microcontroller 108. In another embodiment, the output modules (134 and 136) are further configured to transfer power at a pre-established power level to one or more loads via the load/output line connections or cables 114. In an exemplary embodiment, the rating of the output modules (134 and 136) is in the range of about, but not limited to, 110 VAC, 20 A-40 A, and 220 VAC, 40 A-50 A. In one embodiment, the microcontroller 108 is further configured to wirelessly communicate to one or more wireless communication devices, such as a smartphone for example, via a wireless communication module and an ethernet module.

In one embodiment, the wireless communication module and ethernet module are configured to transfer data, via a wireless network, to one or more wireless communication devices. In another embodiment, the wireless communication device is at least any one of a smartphone, a laptop, a computer, a personal digital assistant (PDA), and a tablet. In yet another embodiment, the wireless network is at least any one of a Bluetooth®, Wi-Fi, radio waves, wireless local area networks (WLANs), and wireless sensor networks. In some embodiments, the system 100 comprises at least one universal serial bus port (USB) to transfer the data via a wired connection to at least one wireless communication device. In another embodiment, the output modules (134 and 136) transfer data to one or more loads in various formats and protocols including, but not limiting to, ethernet, USB, Bluetooth®, wireless, digital readout and wireless or mobile application.

In one embodiment, the microcontroller 108 is positioned within the enclosure and is operatively and electrically connected to the one or more bus bars 124, plurality of module insertion points or plug-in points 123, and the one or more expansion ports/connections 116. In one embodiment, the microcontroller 108 is integrated with a human machine interface (HMI). In one embodiment, the microcontroller 108 is configured to control the operation of the system and conduct the circuit tests for securely transferring electrical power and data to the plurality of outlets or loads via the bus bars 124 and the plurality of output modules (134 and 136) without using a breaker. In one embodiment, the circuit tests such as, but not limited to, a short circuit test and an open circuit test.

In one embodiment, the microcontroller 108 is configured to conduct circuit tests, for example, short circuit and open circuit tests, when at least one load is connected to the system 100 via at least one output modules (134 and 136). The circuit tests ensure secure transfer of power and data to the loads via the plurality of transmission traces and the plurality of output modules without using a breaker. In another embodiment, the microcontroller 108 is further configured to communicate all circuit conditions via, but not limited to, the USB port, the ethernet module, the wireless communication module, and a software application using a wireless communication device, for example, a smartphone. In another embodiment, the microcontroller 108 is further configured to communicate all circuit conditions via the human machine interface (HMI). In another embodiment, the microcontroller 108 is further configured to collect data from the output driven devices and loads and determine a time period at which the output module should be turned off.

In one embodiment, the plurality of output modules (134 and 136) is configured to transfer power to one or more loads at pre-established level from the input power line 106 after successful competition of testing of the circuit tests by the microcontroller 108, thereby securely transferring power to one or more loads via the bus bars 125 (shown in FIG. 3) and data on bus bars 124 (shown in FIG. 2) to the plurality of output modules (134 and 136) without using circuit breakers.

In one embodiment, the system 100 is further configured to track one or more wireless communication devices associated with the user via the microcontroller 108 and initiate lighting of each space being occupied by the user at the time of detection, and the turn off of the lighting as the tracked wireless communication device leaves the previously occupied space. In another embodiment, the system 100 is further configured to use the speed of the microcontroller 108 to determine one or more ground fault interrupt (GFI) conditions. If determined to be present, the system 100 is configured to turn off the load circuit indicting the GFI fault. In another embodiment, the system 100 is further configured to transfer power to one or more loads and achieve line and load regulations during unavailability of power. In another embodiment, the system 100 is further configured to establish an open gapped connection in the event of a component failure. In one embodiment, the system 100 meets all the standards for power sourcing and distribution in a residential or commercial property, and will be capable of supplying all power fed circuits without the use of mechanical circuit breakers. In another embodiment, the system 100 has the ability to be wired through the standard terminal methods or new and novel method whereby wire stripping will not be required to firmly set the connections. In another embodiment, the system 100 is further configured to include additional circuits beyond the number defined by the specific model. In another embodiment, the system 100 is further configured to connect to one or more additional panels via the MC data bus. In another embodiment, the system 100 is further configured to back up the power to the power source such as, but not limited to, the electric utility or the power grid and batteries. In another embodiment, the system 100 further comprises one or more open or empty slots 142.

Figure 5:
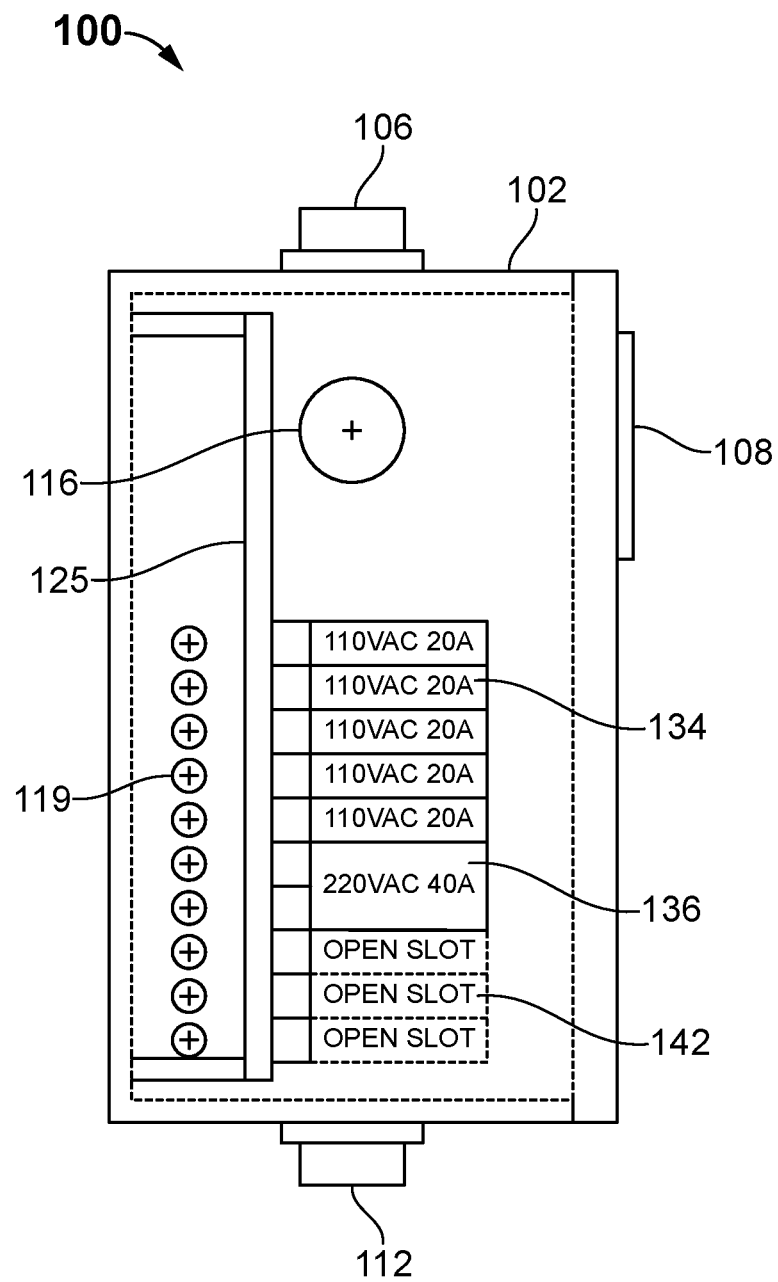
FIG. 5 shows a left-side view of the electric power distribution panel/system in one embodiment of the present innovation.
Figure 6:
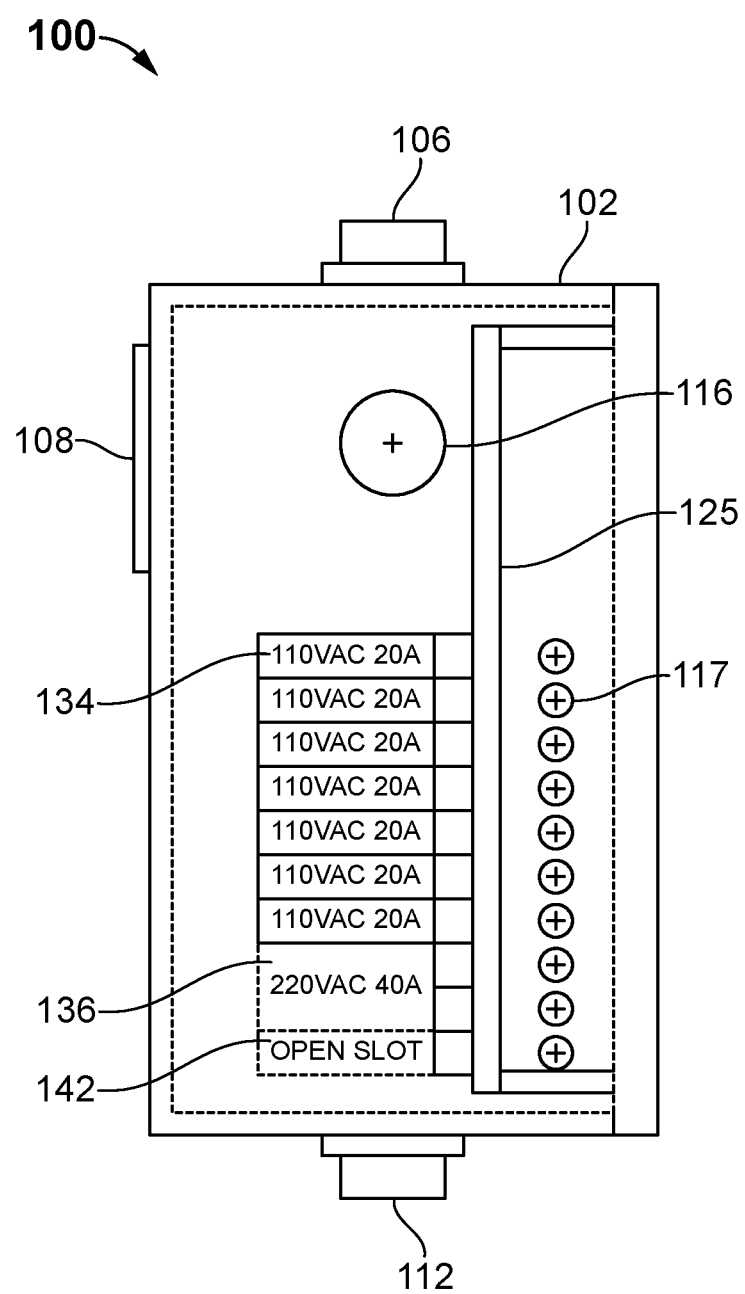
FIG. 6 shows a right-side view of the electric power distribution panel/system in one embodiment of the present innovation.

FIGS. 5-6 disclose the electric power distribution panel/system 100 that comprises a plurality of output connections/ports (117 and 119). In one embodiment, the microcontroller 108 incorporates all logic/programming onboard enabling the system to execute software instructions embedded in the microcontroller 108. In another embodiment, the microcontroller 108 includes a memory and/or database for storing and executing the instructions that are required for the system's operation 100. In another embodiment, the microcontroller 108 is further configured to initiate a circuit test. The output modules (134 and 136) may transfer power to one or more loads at pre-established levels from the input power line 106 after completion of circuit tests by the microcontroller 108. In another embodiment, the microcontroller 108 is further configured to control and monitor the loads to prevent excess arcing and/or excess electrical loads, unauthorized connections, and/or short circuits. In another embodiment, the system 100 further comprises one or more open or empty slots for increased loads in the base unit 142.

In one embodiment, the system 100 is further configured to transfer and store data related to power consumption, power levels, and frequency and power demands. In another embodiment, the system 100 is further configured to develop reports, projections of power demands, and anticipate on the occurrence of conflict using the stored data. In another embodiment, the system 100 may be constructed in a similar manner typical to the current "circuit breaker box design" without the use of circuit breakers incorporating all required power bus bars 125 for power transmission/distribution. In another embodiment, the expansion ports 116 are positioned on, but not limited to, side portions of the enclosure 102. In another embodiment, the expansion ports/connections 116 are configured to connect to at least one existing power panel via a power data bus for transferring power.

In an exemplary embodiment, the rating of the output module 134 is about, but not limited to, 110 VAC and 20 A and the rating of the output module 136 ranges from approximately 220 VAC and 40 A-50 A, but is not necessarily limited to such ranges. In another embodiment, each output modules (134 and 136) of the system 100 further comprises a reset button. In another embodiment, the system 100 further comprises one or more energy storage devices configured to store power generated from auxiliary power sources, such as one or more solar panels. In another embodiment, the one or more energy storage devices could be, but not limited to, DC batteries. In another embodiment, the microcontroller 108 is further configured to switch from the main power to auxiliary power. In another embodiment, the system 100 is further configured to transfer power to a power grid when the consumption of power is less than the auxiliary power being sourced. In another embodiment, the system 100 further comprises a remote-control system, configured to remotely control power conditions, power levels, duration of power levels, and power consumptions, and load regulations.

Preferred embodiments of this innovation are described herein, including the best mode known to the inventors for carrying out the innovation. It should be understood that the illustrated embodiments are exemplary only and should not be taken as limiting the scope of the innovation.

The foregoing description comprise illustrative embodiments of the present innovation. Having thus described exemplary embodiments of the present innovation, it should be noted by those skilled in the art that the within disclosures are exemplary only, and that various other alternatives, adaptations, and modifications may be made within the scope of the present innovation. Merely listing or numbering the steps of a method in a certain order does not constitute any limitation on the order of the steps of that method. Many modifications and other embodiments of the innovation will come to mind to one skilled in the art to which this innovation pertains having the benefit of the teachings in the foregoing descriptions. Although specific terms may be employed herein, they are used only in generic and descriptive sense and not for purposes of limitation. Accordingly, the present innovation is not limited to the specific embodiments illustrated herein.

What is claimed is:

1. An electric power distribution panel, comprising:
   an enclosure having a front panel, wherein the front panel is removably hinged to the enclosure; wherein the enclosure comprises:
   an input power line configured to receive electrical power from a main power source,
   one or more bus bars securely positioned within the enclosure,
   wherein each connection of the one or more bus bars is configured to selectively pass electric power at pre-established levels from the input power line to a plurality of outlets or output modules via a plurality of module insertion points or plug-in points and one or more expansion ports/connections after completion of testing one or more circuit, and
   a microcontroller positioned within the enclosure and is operatively and electrically connected to the one or more bus bars, plurality of module insertion points or plug-in points, and the one or more expansion ports/connections,
   wherein the microcontroller is configured to control the operation of the electric power distribution system and conduct the circuit tests for securely transferring electrical power and data to the plurality of outlets or loads via the bus bars and the plurality of output modules by using a non-mechanical breaker.

2. The electric power distribution panel of claim 1, is further configured to store data related to electrical power consumption, power levels, and frequency and power demands to develop reports, projections of power demands, and anticipate the occurrence of conflict.

3. The electric power distribution panel of claim 1, wherein the microcontroller is further configured to enable or disable electric power and data which selectively passes to the plurality of outlets or loads via the power bus bars and the plurality of output modules, wherein the microcontroller is integrated with a human machine interface (HMI).

4. The electric power distribution panel of claim 1, further comprises a wireless communication module and an ethernet module, wherein the wireless communication module and the ethernet module are configured to transfer data via a wireless network to at least one wireless communication device.

5. The electric power distribution panel of claim 4, wherein the wireless communication device is at least any one of a smartphone, a laptop, a computer, a personal digital assistant (PDA), and/or a tablet.

6. The electric power distribution panel of claim 4, wherein the wireless network is at least any one of a Bluetooth, Wi-Fi, radio wave, wireless local area network (WLAN), and/or a wireless sensor network.

7. The electric power distribution panel of claim 1, further comprises at least one universal serial bus port to transfer the data via a wired connection to at least one wireless communication device.

8. The electric power distribution panel of claim 1, wherein the microcontroller is further configured to control and monitor the one or more loads to prevent and protect from the electric power distribution panel from excessive electric current demands, unauthorized connections, and/or short circuits.

9. The electric power distribution panel of claim 1, wherein the microcontroller is further configured to control the plurality of output modules.

10. The electric power distribution panel of claim 1, is further configured to switch from the main power to auxiliary power via the microcontroller.

11. The electric power distribution panel of claim 1, wherein the microcontroller is further configured to collect data from one or more loads and determine a time period at which the output modules should be turned off.

12. The electric power distribution panel of claim 1, is further configured to connect to one or more power panels via a data bus connection thereby enabling to supply electrical power to the one or more power panels via the data bus connection.

13. The electric power distribution panel of claim 1, further comprises one or more energy storage devices, wherein the one or more energy storage devices are configured to store power generated from one or more solar panels.

14. The electric power distribution panel of claim 1, further comprises one or more auxiliary power ports, configured to feed power from the one or more energy storage devices to the plurality of output modules and to one or more loads.

15. The electric power distribution panel of claim 1, further comprises a remote control system, wherein the remote-control system is configured to enable a user to remotely control power conditions, power levels, duration of power levels, power consumption, and load regulation.

16. The electric power distribution panel of claim 1, is further configured to track one or more wireless communication devices associated with the user and initiating the lighting of each space being occupied by the user at the time of detection and initiate the turning off of the lighting as the tracked device leaves the previously occupied space.

17. The electric power distribution panel of claim 1, is further configured to determine GFI gault conditions via the microcontroller and turn off the load circuit if there is an indication of the GFI fault.

18. The electric power distribution panel of claim 1, is further configured to supply electrical power to achieve line and load requirements during unavailability of main utility power.

19. The electric power distribution panel of claim 1, wherein the front panel further comprises a plurality of lights, wherein the plurality of lights are light emitting diodes (LEDs).

20. The electric power distribution panel of claim 1, wherein the circuit tests include a short circuit test and an open circuit test.

* * * * *

UNITED STATES PATENT AND TRADEMARK OFFICE
CERTIFICATE OF CORRECTION

Page 1 of 1

PATENT NO. : 10,862,277 B1
APPLICATION NO. : 16/932386
DATED : December 8, 2020
INVENTOR(S) : Robert Garrasi, Clay C. Cooper, III and Douglas Vrooman, II It is certified that error appears in the above-identified patent and that said Letters Patent is hereby corrected as shown below:

On the Title Page

Under item (12), "Garrasi" should read --Garrasi, et al.--

Item (72), add the following inventors:
CLAY C. COOPER III, Clifton Park, NY (US)
DOUGLAS VROOMAN, II, Boynton Beach, FL (US)

Signed and Sealed this
Eighth Day of February, 2022

Drew Hirshfeld
*Performing the Functions and Duties of the
Under Secretary of Commerce for Intellectual Property and
Director of the United States Patent and Trademark Office*